(12) United States Patent
Kitamura

(10) Patent No.: US 7,184,481 B2
(45) Date of Patent: Feb. 27, 2007

(54) AUDIO REPRODUCING APPARATUS AND METHOD

(75) Inventor: Mamoru Kitamura, Tokyo (JP)

(73) Assignee: Niigata Seimitsu, Co., Ltd. (JP)

( * ) Notice: Subject to any disclaimer, the term of this patent is extended or adjusted under 35 U.S.C. 154(b) by 748 days.

(21) Appl. No.: 10/628,261

(22) Filed: Jul. 29, 2003

(65) Prior Publication Data

US 2004/0022324 A1 Feb. 5, 2004

Related U.S. Application Data

(63) Continuation of application No. PCT/JP02/00582, filed on Jan. 28, 2002.

(30) Foreign Application Priority Data

Jan. 29, 2001 (JP) .............................. 2001-020046

(51) Int. Cl.
*H03K 7/08* (2006.01)
(52) U.S. Cl. ...................... 375/238; 330/260; 375/316
(58) Field of Classification Search ................ 375/238, 375/239, 237, 240, 241, 242; 330/251, 253, 330/259, 260, 264, 265, 269, 271, 277; 327/31, 327/172; 329/312; 398/191
See application file for complete search history.

(56) References Cited

U.S. PATENT DOCUMENTS 4,810,973 A * 3/1989 Kurz .......................... 330/129
4,823,056 A * 4/1989 Watanabe et al. ............ 388/829
5,121,011 A * 6/1992 Ohya et al. .................. 327/432
5,777,512 A * 7/1998 Tripathi et al. .......... 330/207 A
6,169,765 B1 * 1/2001 Holcombe .................... 375/238
6,362,683 B1 * 3/2002 Miao et al. .................... 330/10
6,794,930 B1 * 9/2004 Nurminen ..................... 330/10

FOREIGN PATENT DOCUMENTS

| JP | 62006525 A | 2/1985 |
|---|---|---|
| JP | 03159409 A | 7/1991 |
| JP | 07-274248 | 10/1995 |
| JP | 2000022458 A | 1/2000 |

* cited by examiner

*Primary Examiner*—Chieh M. Fan
*Assistant Examiner*—Siu M. Lee
(74) *Attorney, Agent, or Firm*—Connolly Bove Lodge & Hutz, LLP; Larry J. Hume

(57) ABSTRACT

A comparator (12) for compensating the pulse width of the drive control signal of a power amplifier (54) by using a sense signal of an offset voltage generated between the nodes (H, I) of the power amplifier (54) is provided to enlarge the time width from the OFF operation of a pair of switching elements (Q1, Q4) to the ON operation of a pair of switching elements (Q2, Q3), thereby preventing the inconvenience that the switching elements (Q1, Q2) simultaneously turn on and suppressing a through-current. The pulse width for turning on the switching elements (Q1, Q4) is so corrected as to be wider or narrower than the pulse width for turning on the switching elements (Q2, Q3), thereby adjusting the intensity of an impressing voltage and canceling the offset voltage.

2 Claims, 4 Drawing Sheets

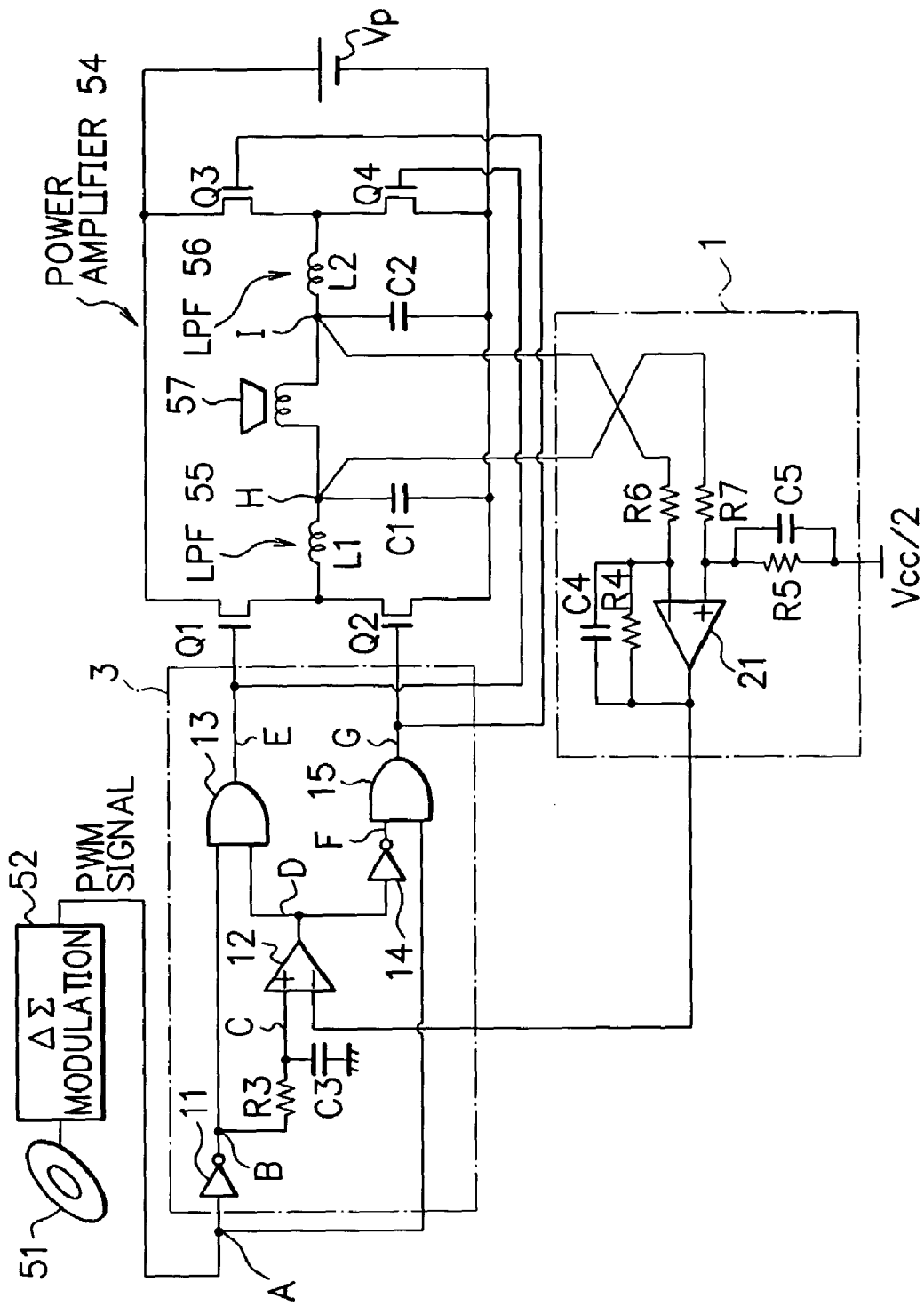
F I G. 2

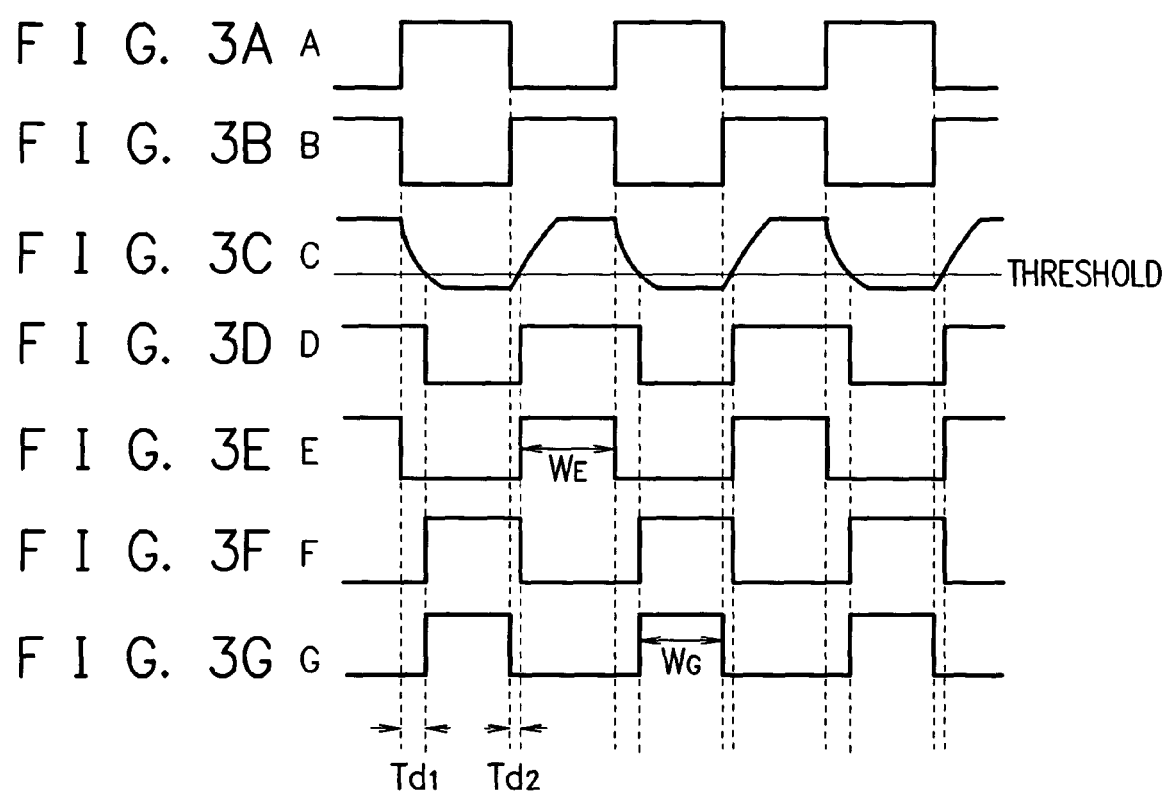

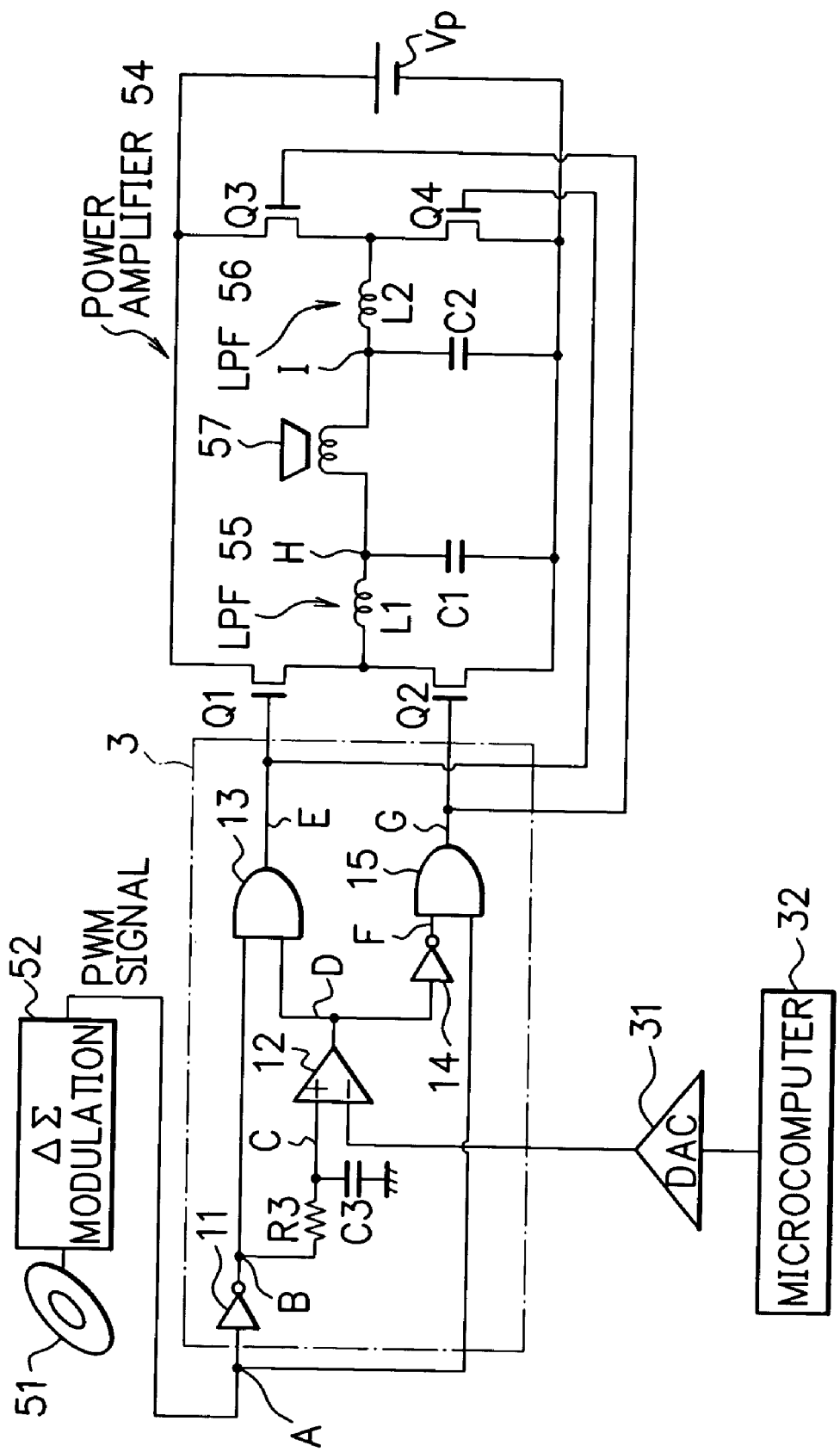

AUDIO REPRODUCING APPARATUS AND METHOD

CROSS-REFERENCE TO RELATED APPLICATIONS

This application is a continuation application under 35 U.S.C. §120 of PCT/JP02/00582 filed on Jan. 28, 2002 by Mamoru Kitamura entitled "Audio Reproducing Apparatus and Method", and which claims priority under 35 U.S.C. §119 to Japanese patent application 2001-20046 filed on Jan. 29, 2001, also by Mamoru Kitamura.

BACKGROUND OF THE INVENTION

1. Field of the Invention

The present invention relates to an audio reproducing apparatus and a method thereof which are in particular suitable to be used for a digital power amplifier for reproducing and analog-outputting digital audio data recorded on a digital signal record medium such as a CD (Compact Disk).

2. Description of the Related Art

In the past, a PCM multi-bit method (hereafter, abbreviated as a PCM method) was adopted as means for representing audio information which is originally an analog signal as a digital signal. The PCM method is also adopted for a CD widely used today. In the case of the PCM method, an operation is performed according to quantization characteristics each time in timing of a sampling frequency (44.1 kHz) to replace the analog signal with the digital signal so as to record an absolute amount of data as to all sample points on the CD.

As opposed to this, attention is recently focused on a 1-bit method whereby distribution of quantization noise is controlled by using $\Delta\Sigma$ modulation and restorability from the digital signal to the original analog signal is thereby improved compared to the PCM method. In the case of the 1-bit method, only a variation against immediately preceding data is recorded as a binary signal without thinning out and interpolating an information amount as with the PCM method, and so a 1-bit signal obtained by quantization shows characteristics very close to those of the analog signal.

Therefore, an audio reproducing apparatus (digital power amplifier) based on the 1-bit method, that is, a so-called 1-bit amplifier has a merit that, unlike the PCM method, it does not require a D/A converter and is able to reproduce the original analog signal by a simple process of just eliminating the digital signal of a high-frequency component with a low-pass filter provided in a final stage.

FIG. 1 is a block diagram schematically showing a configuration of the 1-bit amplifier in the past. In FIG. 1, a $\Delta\Sigma$ modulation portion 52 converts a digital audio 1-bit signal reproduced from a CD 51 based on the $\Delta\Sigma$ modulation so as to obtain a PWM (Pulse Width Modulation) signal. And it supplies the obtained PWM signal to a driver circuit 53, and utilizes it as a control signal for driving a power amplifier 54.

The power amplifier 54 is comprised of a full-bridge switching circuit, and controls ON-state time of the switching elements (MOS transistors Q1 to Q4) so as to amplify an audio signal based on a supplied power-supply voltage Vp and output it. The PWM signal having analog-like width on time base is used as the signal for controlling the switching.

The audio signal amplified by the power amplifier 54 turns to an analog audio signal through low-pass filters (LPF) 55 and 56 comprised of coils L1 and L2 and capacitors C1 and C2 so as to be outputted from a speaker 57. At this time, as shown in FIG. 1, the power amplifier 54 has two MOS transistors Q1 and Q4 and two MOS transistors Q2 and Q3 pair up respectively to be alternately turned on. Thus, a voltage given to the coils of the speaker 57 is allocated to a positive and a negative so as to output the audio signal.

As described above, it is possible, by using the 1-bit amplifier of a configuration as in FIG. 1, to reproduce the original analog signal in a simple process of just eliminating a high-frequency signal with the low-pass filters 55 and 56 without performing D/A conversion on reproduction. In the case of such a configuration, however, there is a problem that a DC offset voltage is generated in a bridge circuit of the power amplifier 54 due to variations in the characteristics of the four MOS transistors Q1 to Q4 so that reproduced sound quality is degraded.

When amplifying the audio signal with the bridge circuit of the power amplifier 54 and outputting it from the speaker 57 under ordinary circumstances, it is necessary to allocate an output voltage to the speaker 57 to the positive and negative centering on null voltage without an offset. However, there is a problem that, if an offset voltage is generated in the bridge circuit, when outputting a loud sound for instance, an output level thereof hits the peak and becomes clipped to distort a waveform of the audio signal, causing an adverse effect on the reproduced sound quality.

The power amplifier 54 of a bridge type is usually designed so that when the pair of MOS transistors Q1 and Q4 is on, the other pair of MOS transistors Q2 and Q3 must be off. However, there is a problem that when switching an ON operation of the pair of MOS transistors Q1 and Q4 and the other pair of MOS transistors Q2 and Q3, there arises a state in which both become on due to the variations in the characteristics (switching speed and so on) of the four MOS transistors Q1 to Q4 and a through-current runs through the MOS transistors Q1 and Q2 or the MOS transistors Q3 and Q4.

The present invention was implemented to solve such problems, and its object is to be able to effectively cancel the offset voltage and through-current generated due to the variations in the characteristics of the switching elements constituting the bridge type power amplifier.

SUMMARY OF THE INVENTION

An audio reproducing apparatus according to the present invention is the one for amplifying an audio signal according to a pulse width modulation signal generated based on a digital audio signal and further filtering it so as to output an analog audio signal, the apparatus comprising: amplification means comprised of a plurality of switching elements for amplifying the audio signal; drive means for generating a drive control signal based on the pulse width modulation signal and controlling ON and OFF of the switching elements according to the drive control signal so as to drive the amplification means; and compensation means for compensating a pulse width of the drive control signal by using a signal according to an offset voltage appeared in the amplification means.

Another aspect of the present invention is the audio reproducing apparatus for amplifying the audio signal according to the pulse width modulation signal generated based on the digital audio signal and further filtering it so as to output the analog audio signal, the apparatus comprising: the amplification means comprised of bridge type switching elements for amplifying the audio signal; the drive means for generating the drive control signal based on the pulse width modulation signal and controlling the ON and OFF of the switching elements according to the drive control signal so as to drive the amplification means; offset voltage detection means for detecting the offset voltage appeared in the amplification means; and compensation means for feeding back and inputting the signal according to the offset voltage detected by the offset voltage detection means to the drive means and compensating the pulse width of the drive control signal by using the signal fed back and inputted.

A further aspect of the present invention is characterized in that the drive means has means for generating the drive control signal for alternately turning on a pair of switching elements and another pair of switching elements of the amplification means based on the pulse width modulation signal, and the compensation means compensates the pulse width of the drive control signal so that time from turning off the pair of switching elements until turning on the other pair of switching elements is at least longer than the time required for switching of the switching elements.

A still further aspect of the present invention is characterized in that the drive means has means for generating the drive control signal for alternately turning on a pair of switching elements and another pair of switching elements of the amplification means based on the pulse width modulation signal, and the compensation means compensates the pulse width of the drive control signal so that the pulse width for turning on the pair of switching elements becomes wider or narrower than the pulse width for turning on the other pair of switching elements based on the signal according to the offset voltage.

A still further aspect of the present invention is characterized in that the compensation means compensates the pulse width of the drive control signal by rendering variable a threshold as a logical boundary between high and low based on the signal according to the offset voltage.

A still further aspect of the present invention is the audio reproducing apparatus for amplifying the audio signal according to the pulse width modulation signal generated based on the digital audio signal and further filtering it so as to output the analog audio signal, the apparatus has the amplification means comprised of the plurality of switching elements for amplifying the audio signal; the drive means for generating the drive control signal based on the pulse width modulation signal and controlling the ON and OFF of the switching elements according to the drive control signal so as to drive the amplification means; and the compensation means for compensating the pulse width of the drive control signal by using the signal according to the offset voltage appeared in the amplification means, and the compensation means has: waveform formation means for dulling an edge of a pulse shape of the pulse width modulation signal; and comparison means for comparing the pulse width modulation signal of which edge is dulled by the waveform formation means to the threshold and outputting a pulse signal having the pulse width according to a comparison result and also rendering the threshold variable by using the signal according to the offset voltage.

A still further aspect of the present invention is the audio reproducing apparatus for amplifying the audio signal according to the pulse width modulation signal generated based on the digital audio signal and further filtering it so as to output the analog audio signal, the apparatus comprising: the amplification means comprised of the bridge type switching elements for amplifying the audio signal; the drive means for generating the drive control signal based on the pulse width modulation signal and controlling the ON and OFF of the switching elements according to the drive control signal so as to drive the amplification means; signal generation means for generating the signal according to the offset voltage of the amplification means; and the compensation means for compensating the pulse width of the drive control signal by using the signal according to the offset voltage generated by the signal generation means.

The audio reproducing method according to the present invention is the one for amplifying the audio signal according to the pulse width modulation signal generated based on the digital audio signal and further filtering it so as to output the analog audio signal, the method characterized by: detecting or generating the signal according to the offset voltage of the amplification means comprised of the plurality of switching elements; and compensating the pulse width of the drive control signal of the amplification means generated based on the pulse width modulation signal by using the signal according to the offset voltage.

Another aspect of the present invention is characterized in that the edge of the pulse shape of the pulse width modulation signal is dulled, the pulse width modulation signal of which edge is dulled is compared to the threshold, the pulse signal having the pulse width according to the comparison result is outputted, and also the threshold is rendered variable by using the signal according to the offset voltage so as to compensate the pulse width of the drive control signal.

According to the present invention constituted as above, the pulse width of the drive control signal for driving the amplification means is compensated based on the signal according to the offset voltage generated in the amplification means, and the amplification means is driven according to the compensated drive control signal.

At this time, a correction is made so that the time from turning off the pair of switching elements of the amplification means until turning on the other pair of switching elements is at least longer than the time required for the switching of the switching elements, and it is thus possible to prevent the inconvenience of having the pair of switching elements and the other pair thereof simultaneously turned on when switching them.

In addition, a correction is made so that the pulse width for turning on the pair of switching elements becomes wider or narrower than the pulse width for turning on the other pair of switching elements, and it is thus possible to adjust intensity of an impressing voltage in a direction for canceling the offset voltage.

BRIEF DESCRIPTION OF THE DRAWINGS

FIG. 2 is a diagram showing a configuration example of the 1-bit amplifier according to this embodiment implementing an audio reproducing apparatus according to the present invention;

FIGS. 3A to 3G are timing charts for explaining operation of the 1-bit amplifier according to this embodiment; and FIG. 4 is a diagram showing another configuration example of the 1-bit amplifier according to this embodiment.

DETAILED DESCRIPTION OF THE PREFERRED EMBODIMENTS

Figure 1:
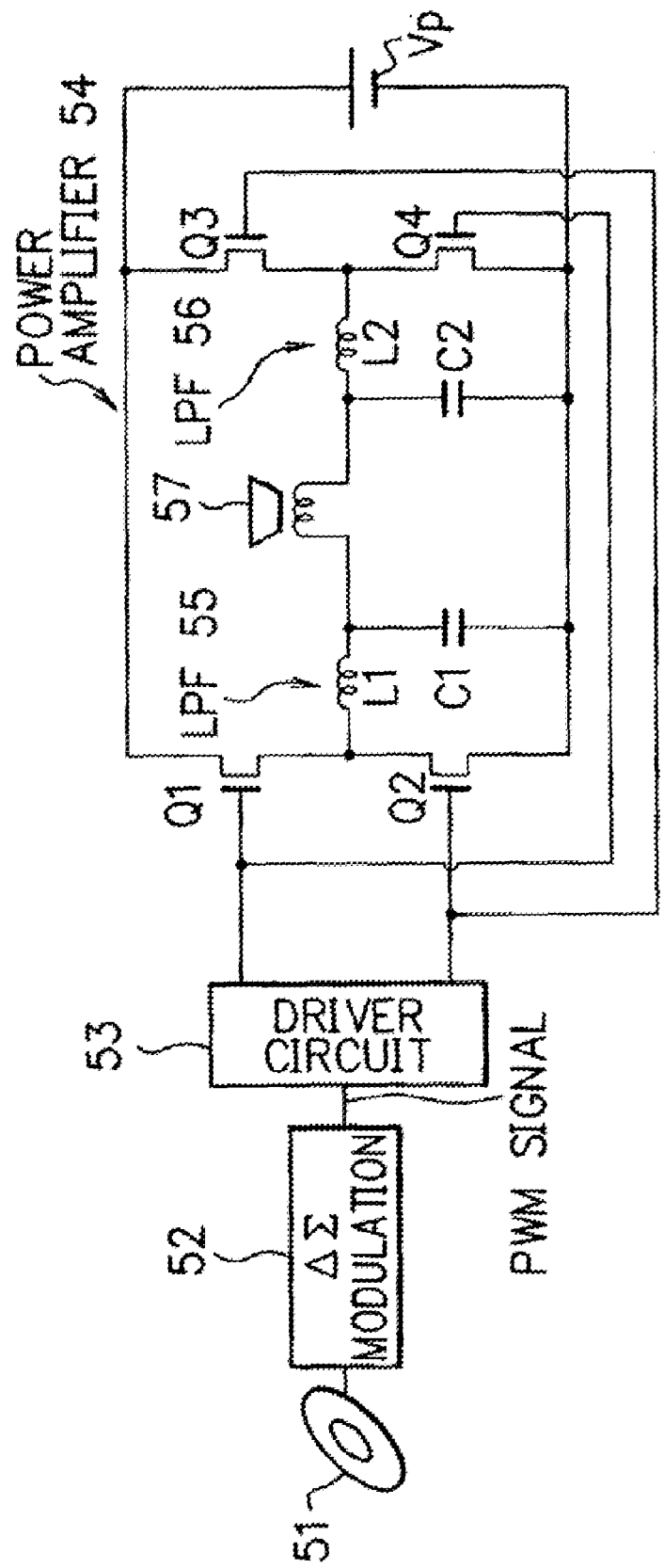
FIG. 1 is a diagram showing a configuration of a 1-bit amplifier of the background art.

Hereafter, an embodiment of the present invention will be described based on the drawings.

FIG. 2 is a diagram showing a configuration example of a 1-bit amplifier according to this embodiment implementing an audio reproducing apparatus according to the present invention. In FIG. 2, components having the same functions as those shown in FIG. 1 are given the same symbols.

As shown in FIG. 2, the 1-bit amplifier according to this embodiment has a ΔΣ modulation portion 52, a driver circuit 3, a power amplifier 54, LPFs 55 and 56 and an offset voltage detection circuit 1. And the driver circuit 3 controls amplification time of the power amplifier 54 based on a PWM signal generated in the ΔΣ modulation portion 52 from a digital audio signal reproduced from a CD 51, and passes an obtained amplification signal through the LPFs 55 and 56 so as to obtain an analog audio signal.

To be more specific, the ΔΣ modulation portion 52 converts a digital audio 1-bit signal reproduced from the CD 51 based on ΔΣ modulation so as to obtain the PWM signal. And it supplies the obtained PWM signal to the driver circuit 3. The driver circuit 3 generates a drive control signal for driving the power amplifier 54 by using the PWM signal supplied from the ΔΣ modulation portion 52.

The power amplifier 54 controls ON-state time of MOS transistors Q1 to Q4 based on the drive control signal supplied from the driver circuit 3 so as to amplify an audio signal based on a supplied power-supply voltage Vp and output it. The audio signal amplified by the power amplifier 54 turns to an analog audio signal through the LPF 55 and 56 so as to be outputted from a speaker 57.

At this time, the offset voltage detection circuit 1 detects an offset voltage generated at both ends of the speaker 57 in a bridge circuit of the power amplifier 54, and feeds it back to the driver circuit 3. The driver circuit 3 adjusts a pulse width of the PWM signal by considering the offset voltage fed back and controls it in a direction of no offset voltage.

Hereafter, a detailed configuration of the driver circuit 3 and offset voltage detection circuit 1 will be described. The driver circuit 3 according to this embodiment has inverters 11 and 14, a comparator 12, AND gates 13 and 15, a resistance R3 and a capacitor C3. Of these, the comparator 12, resistance R3 and capacitor C3 constitute compensation means. The comparator 12 is equivalent to comparison means, and the resistance R3 and capacitor C3 are equivalent to waveform formation means.

The first inverter 11 inverts logic of the PWM signal supplied from the ΔΣ modulation portion 52. An output signal of the first inverter 11 is supplied to one input terminal of the first AND gate 13, and is also supplied to the input terminal on a positive side of the comparator 12 through the resistance R3 and capacitor C3.

The input terminal on a negative side of the comparator 12 has a signal according to the offset voltage detected by the offset voltage detection circuit 1 fed back and inputted thereto. Thus, a threshold voltage to be a boundary when the comparator 12 outputs the signal of "H" or "L" is rendered variable by the offset voltage fed back. The signal outputted from the comparator 12 is supplied to the other input terminal of the first AND gate 13, and is also supplied to one input terminal of the second AND gate 15 via the second inverter 14.

The first AND gate 13 takes an AND of the signal supplied from the first inverter 11 and the signal supplied from the comparator 12 so as to supply the output signal thereof as the drive control signal for controlling the ON-state time of the two MOS transistors Q1 and Q4 of the power amplifier 54. The second AND gate 15 takes the AND of the signal supplied from the second inverter 14 and the signal supplied from the ΔΣ modulation portion 52 so as to supply the output signal thereof as the drive control signal for controlling the ON-state time of the two MOS transistors Q2 and Q3 of the power amplifier 54.

The offset voltage detection circuit 1 according to this embodiment has a comparator 21, a pair of a resistance R4 and a capacitor C4, a pair of a resistance R5 and a capacitor C5, and two resistances R6 and R7. The positive and negative input terminals of the comparator 21 are connected to both ends of the speaker 57 via the two resistances R6 and R7. To be more specific, the input terminal on the positive side of the comparator 21 is connected to a node H via the resistance R7, and the input terminal on the negative side is connected to a node I via the resistance R6.

Here, the node H is the node for generating a positive voltage to be applied to the speaker 57 when the MOS transistors Q1 and Q4 are turned ON (at this time, the voltage drawn from the speaker 57 is generated on the node I). On the other hand, the node I is the node for generating the positive voltage to be applied to the speaker 57 when the MOS transistors Q2 and Q3 are turned on (at this time, voltage drawn from the speaker 57 is generated on the node H).

The comparator 21 detects a DC offset voltage generated at both ends (between the nodes H and I) of the speaker 57 and feeds it back to the input terminal on the negative side of the comparator 12 in the driver circuit 3.

Next, a description will be given as to the operation of the 1-bit amplifier constituted as above, and in particular, that of the driver circuit 3 and the offset voltage detection circuit 1. FIGS. 3A to 3G are timing charts for explaining the operation of the driver circuit 3. Hereafter, the operation will be described by referring to the timing chart in FIG. 3.

Here, it is assumed that the PWM signal of a node A outputted from the ΔΣ modulation portion 52 has a waveform as in FIG. 3A. This PWM signal passes through the first inverter 11 so that the signal of an output node B thereof becomes as shown in FIG. 3B. And as the logically inverted PWM signal passes through the resistance R3 and capacitor C3, rising and trailing edges of the pulse are dulled so as to become the waveform as shown in FIG. 3C.

The signal of the dulled waveform shown in FIG. 3C is inputted to the input terminal on the positive side of the comparator 12. On the other hand, the signal of the offset voltage detected and fed back by the offset voltage detection circuit 1 is inputted to the input terminal on the negative side of the comparator 12, and the threshold for determining "H" or "L" of the output signal of the comparator 12 is thereby adjusted.

For instance, it is assumed that the offset voltage is generated at both ends of the power amplifier 54 and the node I becomes higher than the node H by 100 mV. In this case, the signal of −100 mV is outputted from the comparator 21 in the offset voltage detection circuit 1, and the threshold of the comparator 12 is lowered accordingly. FIG. 3C shows a state in which the threshold is rendered smaller than a standard threshold voltage Vdd/2.

The waveform of a pulse signal appearing on an output node D of the comparator 12 becomes "H" where the level is higher than the threshold in the waveform in FIG. 3C and becomes "L" where the level is lower than the threshold. Accordingly, the pulse waveform becomes as shown in FIG. 3D, which is the waveform wherein rising and trailing of the pulse are delayed compared to the waveform on the input side node B of the comparator 12. According to this embodiment, the resistance R3 and capacitor C3 are provided to a preceding stage of the comparator 12, and the values thereof are adequately determined so as to purposely dull an input waveform of the comparator 12 and further delay the rising and trailing of the pulse waveform of the node D.

The first AND gate 13 takes the AND of the pulse signal of the node B outputted from the first inverter 11 and the pulse signal of the node D outputted from the comparator 12. Thus, the waveform of the signal appearing on an output node E thereof becomes like FIG. 3E.

The pulse signal of the node D outputted from the comparator 12 passes through the second inverter 14 so that the signal of an output node F thereof becomes like FIG. 3F. And the second AND gate 15 takes the AND of the pulse signal of the node F and the pulse signal of the node A. Thus, the waveform of the signal appearing on the output node G becomes like FIG. 3G.

The pulse signal having the waveform of the node E obtained in such a series of operations is supplied as the drive control signal to the two MOS transistors Q1 and Q4 of the power amplifier 54, and the pulse signal having the waveform of the node G is supplied as the drive control signal to the remaining MOS transistors Q2 and Q3.

At this time, as is also apparent in FIG. 3, there arises a dead time $Td_1$ during which none of the MOS transistors Q1 to Q4 is turned on in the period since the signal of the node E is determined as "L" and the MOS transistors Q1 and Q4 become off until the signal of the node G is determined as "H" and the MOS transistors Q2 and Q3 become on. There also arises a dead time $Td_2$ during which none of the MOS transistors Q1 to Q4 is turned on in the period since the signal of the node G is determined as "L" and the MOS transistors Q2 and Q3 become off until the signal of the node E is determined as "H" and the MOS transistors Q1 and Q4 become on.

If the dead times $Td_1$ and $Td_2$ are longer than the time required for the switching of the MOS transistors Q1 to Q4, it no longer happens that, when alternately switching between and turning on the pair of MOS transistors Q1 and Q4 and the other pair of MOS transistors Q2 and Q3 in the bridge circuit, the MOS transistors Q1 and Q2 or the MOS transistors Q3 and Q4 simultaneously become on in timing of the switching so that occurrence of a through-current can be prevented.

According to this embodiment, the threshold of the comparator 12 is adjusted according to a detected offset voltage, and the pulse width is controlled to render the dead times $Td_1$ and $Td_2$ longer than the switching time of the MOS transistors Q1 to Q4 so that the occurrence of the through-current can be prevented. As a matter of fact, in the case where the switching time of the MOS transistors Q1 to Q4 is 5 nsec or so for instance, it is possible to eliminate the through-current if the dead times $Td_1$ and $Td_2$ are 10 nsec or so.

In the case where there is the offset voltage wherein a potential is higher on the node I than on the node H as with the present example, the threshold of the comparator 12 is lowered. Thus, as shown in FIG. 3E and FIG. 3G, a pulse width $W_E$ of the drive control signal for turning on the pair of the MOS transistors Q1 and Q4 is adjusted in a direction to become wider than a pulse width $W_G$ of the drive control signal for turning on the other pair of the MOS transistors Q2 and Q3.

It means that the voltage applied to the pair of the MOS transistors Q1 and Q4 (the voltage of the node H) is adjusted in a direction to become higher than the voltage applied to the other pair of the MOS transistors Q2 and Q3 (the voltage of the node I). Therefore, the offset voltage originally generated between the nodes H and I is thereby effectively canceled by setoff so as to prevent a distortion of reproduced sound.

FIG. 4 is a diagram showing another configuration example of the 1-bit amplifier according to this embodiment, and the components having the same functions as those shown in FIG. 2 are given the same symbols. The 1-bit amplifier shown in FIG. 4 shows another example of the method of detecting the offset voltage of the power amplifier 54 and feeding it back to the driver circuit 3.

As shown in FIG. 4, the offset voltage detection circuit 1 is not provided here, and a DA converter (DAC) 31 is provided instead. The DAC 31 inputs a predetermined signal supplied from a microcomputer 32 and converts it from digital to analog so as to supply the output signal thereof to the input terminal on the negative side of the comparator 12. The microcomputer 32 is a controller for controlling the entire 1-bit amplifier (it is just not shown in FIG. 2).

As for the 1-bit amplifier shown in FIG. 4, a test is conducted before shipment and so on to detect the offset voltage generated at both ends of the speaker 57, and a parameter and so on are set so as to supply the signal equivalent to the offset voltage from the microcomputer 32 to the DAC 31. Thus, the same state as that shown in FIG. 3 is created to cancel the offset voltage.

The offset voltage generated in the power amplifier 54 is the value determined by manufacturing variations in the four MOS transistors Q1 to Q4 constituting the bridge circuit and so on, and it is almost fixed. Therefore, it is possible, by tentatively detecting the fixed offset voltage and inputting a signal for offsetting it to a negative side terminal of the comparator 12 through the microcomputer 32 and the DAC 31, to cancel the offset voltage as in the case in FIG. 2 and also curb the occurrence of the through-current. Furthermore, it is possible to simplify the configuration compared to the case in FIG. 2.

While the offset voltage is almost fixed as described above, an on resistance of the MOS transistors Q1 to Q4 changes according to external factors such as temperature, and the offset voltage also changes to some extent accordingly. Thus, to cancel the changeable offset voltage in real time, it is desirable to form a feedback loop as in FIG. 2 and constantly detect the offset voltage.

According to the example in FIG. 2, the offset voltage detection circuit 1 automatically detects the offset voltage which is different in each device, and so it has a merit that labor of detecting the offset voltage of each device can be omitted.

The embodiment described above shows just one example of concretization in implementing the present invention, and a technical scope of the present invention should not thereby be interpreted in a limited way. To be more specific, the present invention can be implemented in various forms without deviating from its spirit or its major characteristics.

As described in detail above, it is possible, according to the present invention, to effectively cancel the offset voltage and through-current because a correction is made to the pulse width of the drive control signal for driving the amplification means according to the offset voltage generated in the amplification means. To be more specific, a correction is made so that the time from turning off a pair of switching elements of the amplification means until turning on another pair of switching elements is at least longer than the time required for switching of the switching elements, and it is thereby possible to prevent the inconvenience of having the pair of switching elements and the other pair thereof simultaneously turned on and effectively cancel the through-current. A compensation is also made so that the pulse width for turning on the pair of switching elements becomes wider or narrower than the pulse width for turning on the other pair of switching elements, and it is thereby possible to adjust intensity of an impressing voltage and effectively cancel the offset voltage.

Thus, it is possible to eliminate degradation of the reproduced sound quality associated with the through-current and offset voltage and reproduce a higher-quality sound.

INDUSTRIAL APPLICABILITY

The present invention is instrumental in effectively canceling the offset voltage and through-current generated due to the variations in the characteristics of the switching elements constituting a bridge type power amplifier of the audio reproducing apparatus.

What is claimed is:

1. An audio reproducing apparatus for amplifying an audio signal according to a pulse width modulation signal generated based on a digital audio signal and further filtering the amplified audio signal so as to output an analog audio signal, the apparatus comprising:

amplification means comprised of a plurality of switching elements for amplifying the audio signal;

drive means for generating a drive control signal based on the pulse width modulation signal and controlling ON and OFF of the switching elements according to the drive control signal so as to drive the amplification means; and compensation means for compensating a pulse width of the drive control signal by using a signal according to an offset voltage appeared in the amplification means due to variations in characteristics of the switching elements, and the compensation means has:

waveform formation means for dulling an edge of a pulse shape of the pulse width modulation signal; and comparison means for comparing the pulse width modulation signal of which edge is dulled by the waveform formation means to a threshold and outputting a pulse signal having the pulse width according to a comparison result and also rendering the threshold variable by using the signal according to the offset voltage.

2. An audio reproducing method for amplifying an audio signal according to a pulse width modulation signal generated based on a digital audio signal and further filtering the amplified audio signal so as to output an analog audio signal the method comprising, dulling an edge of a pulse shape of the pulse width modulation signal;

comparing the pulse width modulation signal of which edge is dulled to a threshold;

outputting a pulse signal having a pulse width according to the comparison result;

detecting and generating a signal according to an offset voltage of amplification means comprised of a plurality of switching elements; and rendering the threshold variable by using the signal according to the offset voltage so as to compensate a pulse width of a drive control signal of the amplification means generated based on the pulse width modulation signal.

* * * * *